United States Patent
Arai et al.

(10) Patent No.: US 6,433,071 B1
(45) Date of Patent: Aug. 13, 2002

(54) AROMATIC POLYSULFONE RESIN COMPOSITION AND MOLDED ARTICLE THEREOF

(75) Inventors: Noriyuki Arai, Tokyo; Satoshi Nagano, Tsukuba, both of (JP)

(73) Assignee: Sumitomo Chemical Company, Limited, Osaka (JP)

(*) Notice: Subject to any disclaimer, the term of this patent is extended or adjusted under 35 U.S.C. 154(b) by 0 days.

(21) Appl. No.: 09/598,952

(22) Filed: Jun. 22, 2000

(30) Foreign Application Priority Data

Jun. 24, 1999 (JP) ............................. 11-178269
Aug. 25, 1999 (JP) ............................. 11-238543

(51) Int. Cl.⁷ ............................................. C08L 81/06
(52) U.S. Cl. ...................... 524/508; 524/513; 525/133; 525/437; 525/535
(58) Field of Search ................. 525/437, 133; 524/539, 508

(56) References Cited

U.S. PATENT DOCUMENTS 4,386,174 A    5/1983   Cogswell et al.
5,266,037 A  * 11/1993  Hetzel ........................ 439/72
5,910,560 A  *  6/1999  Nagashima ................. 528/196

FOREIGN PATENT DOCUMENTS

| EP | 0470557 A2 | 2/1992 |
| JP | 5740555    | 3/1982 |
| JP | 1252657    | 10/1989 |
| JP | 03095261   | 4/1991 |
| JP | 345107     | 7/1991 |
| JP | 06172647   | 6/1994 |

* cited by examiner

*Primary Examiner*—Patricia A. Short
(74) *Attorney, Agent, or Firm*—Birch, Stewart, Kolasch & Birch, LLP

(57) ABSTRACT

Provided is an aromatic polysulfone resin composition comprising 5 to 50 parts by weight of a liquid crystal polyester resin having a flow temperature of 250 to 320° C., based on 100 parts by weight of an aromatic polysulfone resin having a melt viscosity of less than 500 Pa·s measured at 340° C. and a shear rate of 1000/second and a molded article thereof. The composition shows excellent flowability in molding without losing excellent mechanical property and heat-resistance of the molded article thereof.

9 Claims, No Drawings

AROMATIC POLYSULFONE RESIN COMPOSITION AND MOLDED ARTICLE THEREOF

BACKGROUND OF THE INVENTION

1. Field of the Invention

The present invention relates to an aromatic polysulfone resin composition and a molded article thereof. More specifically, the present invention relates to an aromatic polysulfone resin composition comprising a liquid crystal polyester resin and a molded article thereof.

2. Description of the Related Art

Aromatic polysulfone resins are used in wide variety of fields including electric and electronic materials because of their excellent heat-resistance and mechanical property, and recently, there is a need for improvement in flowability due to requirement for a thin product to be used in small size and light weight.

For improving the flowability of an aromatic polysulfone resin, for example, Japanese Patent Kokoku Publication (JP-B) No. 3-72669 discloses a method for compounding a specific amount of polyphenylene sulfide, and JP-B No.3-45107 disclosed a method for compounding a specific amount of polymer which can form a specific anisotropic melt.

However, in IC sockets having increased amount of pins exemplified by a pin grid array (PGA) and ball grid array (BGA), particularly in burn-in sockets, there has been a problem that conventional aromatic polysulfone resin compositions show insufficient flowability in molding; consequently, the resins can not be completely filled in parts of a mold corresponding to a product and a satisfying product can not be obtained.

The object of the present invention is to solve the above problems and to provide an aromatic polysulfone resin composition which shows excellent flowability in molding without losing excellent mechanical property and heat-resistance, and a molded article thereof.

SUMMARY OF THE INVENTION

The present inventors have intensively studied to solve the above-described problems and found that a resin composition comprising specific amount of a specific liquid crystal polyester resin in a specific aromatic polysulfone resin attains the above-described object, and completed the present invention.

That is, the present invention relates to an aromatic polysulfone resin composition comprising 5 to 50 parts by weight of a liquid crystal polyester resin having a flow temperature as defined below of 250 to 320° C., and 100 parts by weight of an aromatic polysulfone resin having a melt viscosity of less than 500 Pa·s measured at 340° C. and a shear rate of 1000/second:

Flow temperature: a temperature at which the melt viscosity is 4800 Pa·s when a resin being heated at a heating rate of 4° C./min. is extruded by using a capillary rheometer having a nozzle having an internal diameter of 1 mm and a length of 10 mm under a load of 100 kg/cm².

DETAILED DESCRIPTION OF THE INVENTION

In the present invention, the aromatic polysulfone resin is a polyarylene compound which comprises an arylene unit, ether bond and sulfone bond as essential three repeating structural units and in which the arylene unit is situated disorderly or orderly together with the ether bond and the sulfone bond.

The aromatic polysulfone resin used in the present invention is an aromatic polysulfone resin having a melt viscosity measured at 340° C. and a shear rate of 1000/second of less than 500 Pa·s. If an aromatic polysulfone resin having such a melt viscosity of 500 Pa·s or more is used, the flowability of the resin composition in molding may not be excellent. The melt viscosity is preferably 200 Pa·s or more, and more preferably 300 Pa·s or more. If the melt viscosity is less than 200 Pa·s, the mechanical strength of the molded article is insufficient sometimes.

As the structural unit of the aromatic polysulfone resin used in the present invention, those represented by the following general formulae (I), (II) and (III) are exemplified.

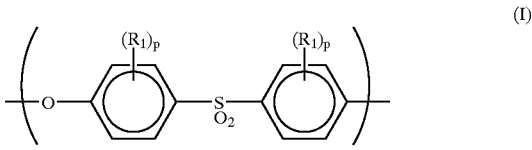

In the formula (I), $R_1$ represents an alkyl group having 1 to 6 carbon atoms, an alkenyl group having 3 to 10 carbon atoms, a phenyl group or a halogen atom, p is an integer from 0 to 4. $R_1$s on the same or different nuclei may be different from each other. The symbols "p"s may be different from each other.

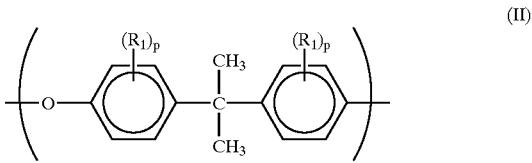

In the formula (II), $R_1$ and p are the same as defined in the formula (I).

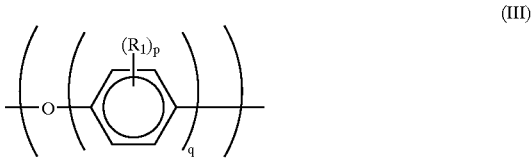

In the formula (III), $R_1$ and p are the same as defined in the formula (I). The symbol "q" is an integer from 1 to 3.

When the aromatic polysulfone resin is composed of the above-described structural unit (I), p in (I) is preferably 0. When the aromatic polysulfone resin is composed of the above-described structural units (I) and (II), the molar ratio (I)/(II) is usually from 0.1 to 50, preferably from 0.1 to 9.0. and more preferably from 1.0 to 4.0. Further, when the aromatic polysulfone resin is composed of the above-described structural units (I) and (III), the molar ratio (I)/(III) is usually from 0.1 to 20, preferably from 0.1 to 9.0, and more preferably from 1.0 to 4.0.

Among them, those composed of the above-described structural unit (I) and those composed of the above-described structural units (I) and (II) are preferable, and those composed of the above-described structural unit (I) are further preferable.

As the method for producing the aromatic polysulfone resin used in the present invention, known methods can be adopted. As commercially available aromatic polysulfone resins, examples of those composed of the above-described structural unit (I) include Sumika Excel PES 3600P: trade name, manufactured by Sumitomo Chemical Co, Ltd. The terminal structure thereof is depend upon the methods for producing respective resins, and examples thereof include —Cl, —OH, —OR (R is an alkyl group) and the like.

In the present invention, the liquid crystal polyester resin is a polyester generally called thermotropic liquid crystal polymer, and that which forms an anisotropic melt at a temperature of 400° C. or less is preferable. Specific examples thereof include:

those comprising an aromatic dicarboxylic acid, aromatic diol and aromatic hydroxycarboxylic acid in combination; those comprising different aromatic hydroxycarboxylic acids;

those comprising an aromatic dicarboxylic acid and an aromatic diol in combination;

those obtained by reacting an aromatic hydroxycarboxylic acid with a polyester such as polyethylene terephthalate and the like. Instead of these aromatic dicarboxylic acids, aromatic diols and aromatic hydroxycarboxylic acids, ester-forming derivatives thereof may also be used.

The liquid crystal polyester resin used in the present invention has a flow temperature as defined below of 250 to 320° C., preferably of 270 to 310° C.

Flow temperature: a temperature at which the melt viscosity is 4800 Pa·s when a resin being heated at a heating rate of 4° C./min. is extruded by using a capillary rheometer having a nozzle having an internal diameter of 1 mm and a length of 10 mm under a load of 100 kg/cm².

When a liquid crystal polyester resin having the flow temperature over 320° C. is used, the flowability of the resin composition in flowing may be insufficient, and when a liquid crystal polyester resin having the flow temperature less than 250° C. is used, the blocking of a pellet of the resin composition may be induced, or the heat-resistance of the molded article may decrease.

As the structural unit of the liquid crystal polyester resin used in the present invention, followings are exemplified.

Structural units derived from aromatic hydroxycarboxylic acids:

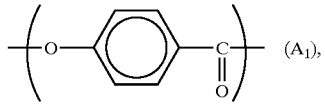 (A₁),

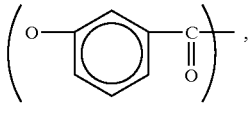

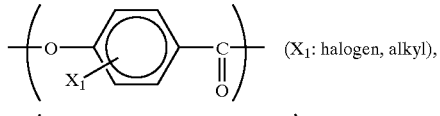 (X₁: halogen, alkyl),

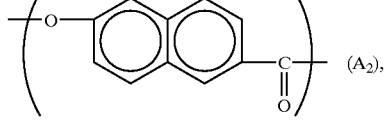 (A₂),

-continued

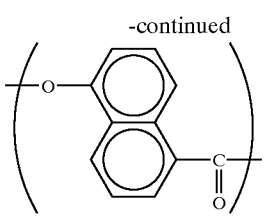

Structural units derived from aromatic dicarboxylic acids:

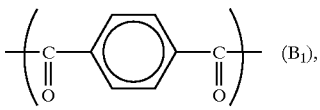 (B₁),

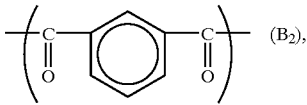 (B₂),

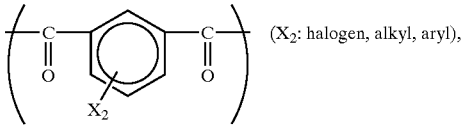 (X₂: halogen, alkyl, aryl),

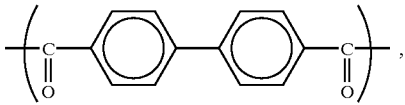,

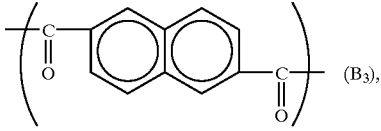 (B₃),

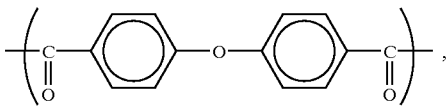,

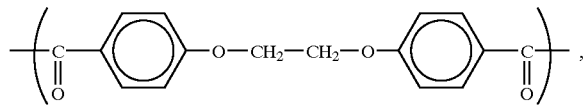,

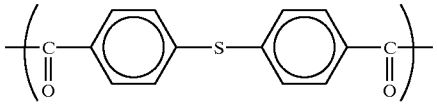

Structural units derived from aromatic diols:

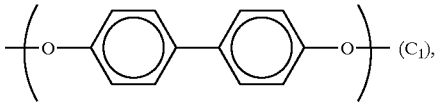 (C₁),

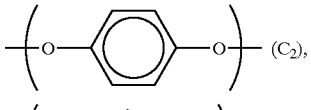 (C₂),

 (C₃),

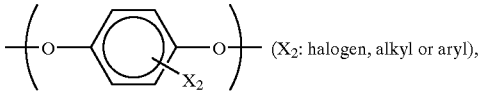 (X₂: halogen, alkyl or aryl),

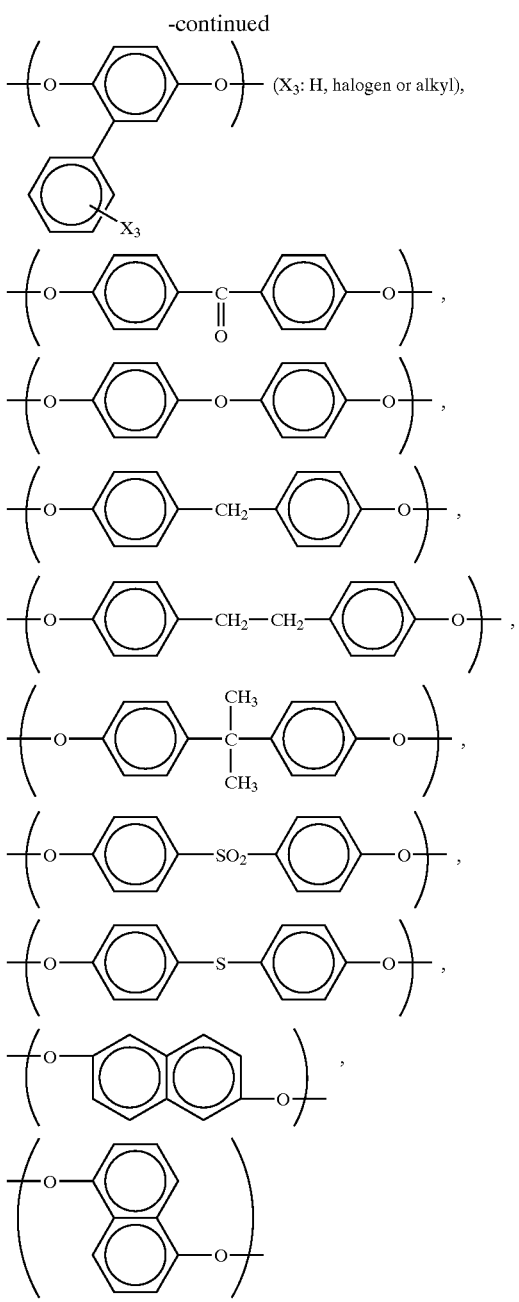

In the definition of the above substituents $X_1$ to $X_3$, "H" is a hydrogen atom, "alkyl" is preferably an alkyl group having 1 to 10 carbon atoms, and "aryl" is preferably an aryl group having 6 to 20 carbon atoms.

Among combinations of the above-described structural units:

($A_1$), ($B_1$), ($B_2$), ($C_1$);
($A_1$), ($B_1$), ($B_2$), ($C_2$); and
($A_1$), ($B_1$), ($B_2$), ($C_1$), ($C_2$)

are preferable from the standpoints of processability, flowability and heat-resistance of the composition, and the molar ratio $[(C_1)+(C_2)]/(A_1)$ is preferably from 0.2 to 1.0, the molar ratio $[(B_1)+(B_2)]/[(C_1)+(C_2)]$ is preferably from 0.9 to 1.1, and the molar ratio $(B_1)/(B_2)$ is preferably from 1 to 30.

As the method for producing the aromatic polyester resin used in the present invention, known methods can be adopted, and described, for example, Japanese Patent Kokoku Publication (JP-B) Nos. 47-47870, 63-3888 and the like.

In the aromatic polysulfone resin composition of the present invention, the content of the liquid crystal polyester resin is from 5 to 50 parts by weight based on 100 parts by weight of an aromatic polysulfone resin, and preferably 10 to 25 parts by weight based on 100 parts by weight of an aromatic polysulfone resin. When less than 5 parts by weight, an effect for improving flowability is poor, whereas when over 50 parts by weight, the anisotropy of molding shrinkage ratio and weld strength may decrease, undesirably.

In the polysulfone resin composition of the present invention, a fluororesin may also be contained. By this inclusion, the releasability may also be improved, and in further precise molding, removal from a mold becomes easy without resulting breakage and deformation of a molded article having a fine structure. Moreover, the lubricative property of a molded article with contact pins is improved.

Examples of the fluororesin used in the present invention include polytetrafluoroethylene, tetrafluoroethylene-hexafluoropropylene copolymer, polytrichlorofluoroethylene, tetrafluoroethylene-perfluoroalkyl vinyl ether copolymer and the like, and one or more of them can be used. Among them, polytetrafluoroethylene is preferably from the standpoint of heat-resistance.

The amount of the fluororesin is from 0.5 to 30 parts by weight, preferably from 0.8 to 30 parts by weight, further preferably from 1.0 to 10 parts by weight based on 100 parts by weight of an aromatic polysulfone resin. When less than 0.5 parts by weight, an effect for improving releasability in molding may be poor, whereas, when over 30 parts by weight, the strength of a molded article may decrease, being undesirable also from the economical standpoint.

The aromatic polysulfone resin composition of the present invention may also contain an inorganic filler for the purpose of improving the mechanical property of a molded article, if necessary. Examples of the inorganic filler include reinforcing materials in the form of fiber or needle such as glass fiber, silica alumina fiber, wollastonite, potassium titanate whisker and the like, and exemplified are calcium carbonate, dolomite, talc, mica, clay, glass bead and the like, and one or more of them can be used. Among them, the glass fiber is preferable. The amount of the inorganic filler is usually from 5 to 100 parts by weight, preferably from 10 to 70 parts by weight based on 100 parts by weight of an aromatic polysulfone resin. When the amount is less than 5 parts by weight, an effect of reinforcement by an inorganic filler may not be sufficient, and when over 100 parts by weight, molding property may be poor.

In the aromatic polysulfone resin composition of the present invention, if necessary, one or more of thermoplastic resins, for example, polyamide, polyester, polyphenylene sulfide, polyether ketone, polycarbonate, polyphenylene ether, polyether sulfone, polyether imide and the like can be added. Further, one or more of thermosetting resins, for example, phenol resins, epoxy resins, polyimide resins and the like may also be contained.

Further, the aromatic polysulfone resin composition of the present invention may contain, if necessary, one or more of usual additives such as coloring agents like dyes, pigments and the like; antioxidants, heat stabilizers, ultraviolet ray absorbers, antistatic agents, surfactants and the like.

As the method for compounding raw material components for obtaining the aromatic polysulfone resin composition of the present invention, an aromatic polysulfone resin, a liquid crystal polyester resin, if necessary, an inorganic filler and the like are mixed by using a Henschel mixer, tumbler mixer and the like, then, the mixture is melt-kneaded using an extruder.

The aromatic polysulfone resin composition of the present invention can be molded into various parts and members by a usual method. As the molding method, an injection molding method, compression molding method, extrusion molding method, hollow molding method and the like are listed, and the injection molding method is preferable. Examples of the molded article include electric and electronic parts such as a connector, socket, relay parts, coil bobbin, light pick up, vibrator, printed circuit board, computer-related parts and the like; semiconductor production process-related parts such as an IC tray, wafer carrier, and the like; domestic electric appliances such as a VTR, television, iron, air conditioner, stereo, cleaner, refrigerator, rice cooker, illumination instruments and the like: illumination instrument parts such as a lamp reflector, lamp holder and the like; audio product parts such as a compact disc, laser disc, speaker and the like; communication instrument parts such as an optical cable ferrule, telephone parts, facsimile parts, modem and the like; copy machine-related parts such as a stripping finger, heater holder and the like; machine parts such as an impeller, fan, gear wheel, gear, bearing, motor-parts and case and the like; automobile parts such as automobile mechanism parts, engine parts, engine room internal parts, electrical parts, interior parts and the like; cooking appliances such as a microwave cooking pan, heat-resistant dish and the like; building and construction materials such as heat-insulation and sound-insulation materials such as a flooring material, wall material and the like, supporting materials such as a beam, pillar and the like, roofing materials and the like; air plane parts, space machine parts, members of radiation facility such as a nuclear reactor, marine facility members, washing jig, optical instrument parts, valves, pipes, nozzles, filters, film, medical instrument parts and medical material, parts of sensors, sanitary equipment, sport goods, leisure goods and the like.

Among other, IC sockets, particularly a burn-in socket is required to have mechanical property which can endure the load in inserting the IC and to have heat-resistance under test conditions, while there is a progress of a thinner and more complicated form to be applied to an IC having an increased amount of pins, exemplified by a pin grid array (PGA) and ball grid array (BGA). Therefore, the aromatic polysulfone resin composition of the present invention which has excellent flowability in molding, has mechanical property and heat-resistance required by the molded article is suitably used for an IC socket, particularly for an IC burn-in socket.

EXAMPLES

The following examples illustrate the present invention, but do not limit the scope of the present invention. Measurements of physical properties in the examples were conducted according to the following methods.

Spiral flow: An injection molding machine (Neomat N110/45, manufactured by Sumitomo Heavy Industries, Ltd.), and a spiral flow measuring mold having a width of 8 mm and a thickness of 1 mm in direct gate mode were used, and the flow length was measured under conditions of an injection speed of 45 mm/s, an injection pressure of 1400 kg/cm$^2$, a heating cylinder temperature of 360° C., and a mold temperature of 150° C.

Flexural strength, flexural modulus: A specimen having a length of 127 mm, a width of 12.7 mm and a thickness of 6.4 mm was used, and it was measured according to ASTM D790.

Tensile strength: Tensile strength was measured according to ASTM D638 using ASTM No. 4 dumbbell.

Deflection temperature under load: It was measured using a specimen having a length of 127 mm, a width of 12.7 mm and a thickness of 6.4 mm, according to ASTM D648 under a load of 18.6 kg/cm$^2$.

Releasing resistance, releasability: A cylindrical bush having an internal diameter of 11 mm and a height of 15 mm was molded at a cylinder temperature of 360° C., a mold temperature of 150° C., injection speed of 45 mm/s and an injection pressure of 1120 kg/cm$^2$, using an injection molding machine (Neomat N110/45, manufactured by Sumitomo Heavy Industries, Ltd.), and releasing resistance when the molded article was released from the mold was detected by setting a pressure sensor on an ejector pin. Releasability is a value obtained by calculating the ratio of the releasing resistance values of a composition containing a fluororesin and that of a composition containing no fluororesin as a standard (100%).

$$\text{Releasability} = \frac{\text{Releasing resistance of the composition containing fluororesin}}{\text{Releasing resistance of the same composition except the fluororesin is not contained}} \times 100 \ (\%)$$

Examples 1–6, and Comparative Examples 1–2

Resin composition were obtained by mixing the following components in an amount shown in Tables 1–2, then, granulating the mixtures using a twin screw extruder (type PCM-30: manufactured by Ikegai Corporation) at a cylinder temperature of 360° C.

Aromatic polysulfone resin: Sumika Excel PES 3600P, manufactured by Sumitomo Chemical Co, Ltd. (melt viscosity at 340° C. and a shear rate of 1000/second is 366 Pa·s) or Sumika Excel PES 4100P, manufactured by Sumitomo Chemical Co, Ltd. (melt viscosity at 340° C. and a shear rate of 1000/second is 529 Pa·s)

Liquid crystal polyester resin: A liquid crystal polyester resin which is composed of the above-mentioned structural units ($A_1$), ($B_1$), ($B_2$) and ($C_1$), in which the molar ratio ($A_1$):($B_1$):($B_2$):($C_1$) is 60:12:8:20, and which has a flow temperature of 287° C.

Fluororesin: Fluorene L169J (trade name), manufactured by Mitsui Fluorocarbon Co., Ltd.

Barium stearate: SB (trade name), manufactured by Sakai Chemical Industry Co., Ltd.

Glass fiber: CS03JAPx-1 (trade name), manufactured by Asahi Fiber Glass Co., Ltd.

The resulting pellets were subjected to physical property evaluations according to the above-mentioned methods. Results are shown in Tables 1 and 2.

TABLE 1

|  | Example 1 | Example 2 | Comparative Example 1 | Comparative Example 2 |
|---|---|---|---|---|
| Composition (parts by weight) | | | | |
| Sumika Excel PES 3600P | 70 | 66 | 80 | — |
| Sumika Excel PES 4100P | — | — | — | 70 |
| Liquid crystal polyester resin | 10 | 14 | — | 10 |
| Glass fiber | 20 | 20 | 20 | 20 |
| Evaluation | | | | |
| Spiral flow (cm) | 17 | 23 | 10 | 15 |
| Flexural strength (kg/cm$^2$) | 1540 | 1400 | 1750 | 1750 |
| Flexural modulus | 77000 | 75000 | 71000 | 80000 |

TABLE 1-continued

| | Example 1 | Example 2 | Comparative Example 1 | Comparative Example 2 |
|---|---|---|---|---|
| (kg/cm$^2$) | | | | |
| Tensile strength (kg/cm$^2$) | 1200 | 1170 | 1230 | 1400 |
| Tensile elongation (%) | 4 | 4 | 3 | 5 |
| Deflection temperature under load (° C.) | 213 | 211 | 217 | 214 |

TABLE 2

| | Example 3 | Example 4 | Example 5 | Example 6 |
|---|---|---|---|---|
| Composition (parts by weight) | | | | |
| Sumika Excel PES 3600P | 66.8 | 67.1 | 66.4 | 69.1 |
| Liquid crystal polyester resin | 12.2 | 10.9 | 13.6 | 10.9 |
| Fluororesin | 1.0 | 2.0 | — | — |
| Barium stearate | — | — | — | 0.1 |
| Glass fiber | 20 | 20 | 20 | 20 |
| Evaluation | | | | |
| Spiral flow (cm) | 20 | 18 | 22 | 18 |
| Flexural strength (kg/cm$^2$) | 1370 | 1380 | 1250 | 1340 |
| Flexural modulus (kg/cm$^2$) | 78700 | 77300 | 80400 | 76900 |
| Tensile strength (kg/cm$^2$) | 1050 | 1120 | 1080 | 1050 |
| Tensile elongation (%) | 4 | 4 | 4 | 4 |
| Releasing resistance (kg) | 460 | 390 | 500 | 500 |
| Releasability (%) | 92 | 78 | 100 | 100 |
| Deflection temperature under load (° C.) | 214 | 214 | 213 | 212 |

The aromatic polysulfone resin composition of the present invention has excellent flowability in molding, and suitably used in molded articles such as electronic and electric parts and the like, among others, IC sockets, particularly IC socket burn-in sockets.

What is claimed is:

1. An aromatic polysulfone resin composition comprising 5 to 50 parts by weight of a liquid crystal polyester resin having a flow temperature as defined below of 250 to 320° C. based on 100 parts by weight of an aromatic polysulfone resin having a melt viscosity of less than 500 Pa·s measured at 340° C. and a shear rate of 1000/second, wherein the liquid crystal polyester resin is at least one selected from a resin composed of the following structural units (A$_1$), (B$_1$), (B$_2$) and (C$_1$), a resin composed of the following structural units (A$_1$), (B$_1$), (B$_2$) and (C$_2$), and a resin composed of the following structural units (A$_1$), (B$_1$), (B$_2$), (C$_1$) and (C$_2$), and the molar ratio [(C$_1$)+(C$_2$)]/(A$_1$) is from 0.2 to 1.0, the molar ratio [(B$_1$)+(B$_2$)]/[(C$_1$)+(C$_2$)] is from 0.9 to 1.1, and the molar ratio (B$_1$)/(B$_2$) is from 1 to 30,

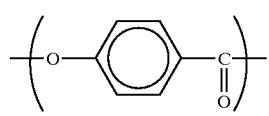  (A$_1$)

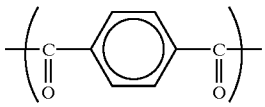  (B$_1$)

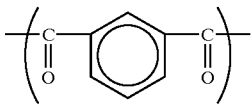  (B$_2$)

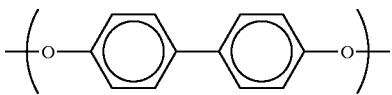  (C$_1$)

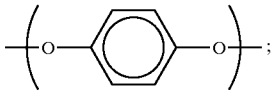  (C$_2$)

Flow temperature: a temperature at which the melt viscosity is 4800 Pa·s when a resin being heated at a heating rate of 4° C./min. is extruded by using a capillary rheometer having a nozzle having an internal diameter of 1 mm and a length of 10 mm under a load of 100 kg/cm$^2$.

2. The aromatic polysulfone resin composition according to claim 1, further comprising 0.5 to 30 parts by weight of a fluororesin based on 100 parts by weight of the aromatic polysulfone resin.

3. The aromatic polysulfone resin composition according to claim 1 or 2 wherein the melt viscosity of the aromatic polysulfone resin is from 200 to 500 Pa·s.

4. The aromatic polysulfone resin composition according to claim 1 or 2 wherein the aromatic polysulfone resin comprises the following structural unit,

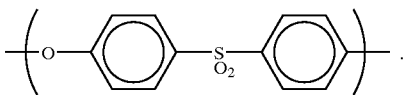

5. The aromatic polysulfone resin composition according to claim 1 or 2 wherein the aromatic polysulfone resin comprises 80 mol % or more of the following structural unit,

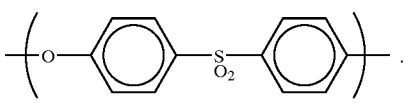

6. The aromatic polysulfone resin composition according to claim 1 or 2, comprising 5 to 100 parts by weight of an inorganic filler based on 100 parts by weight of the aromatic polysulfone resin.

7. A molded article obtained by molding the aromatic polysulfone resin composition of claim 1 or 2.

8. An IC socket obtained by molding the aromatic polysulfone resin composition of claim 1 or 2.

9. An IC burn-in socket obtained by molding the aromatic polysulfone resin composition of claim 1 or 2.

* * * * *